United States Patent [19]

Tharmaratnam

[11] 3,879,745

[45] Apr. 22, 1975

[54] SEMICONDUCTOR DEVICE

[75] Inventor: Poothathamby Tharmaratnam, Nijmegen, Netherlands

[73] Assignee: U.S. Philips Corporation, New York, N.Y.

[22] Filed: Feb. 19, 1974

[21] Appl. No.: 443,258

Related U.S. Application Data

[63] Continuation of Ser. No. 288,919, Sept. 14, 1972, abandoned, which is a continuation of Ser. No. 86,517, Nov. 3, 1970, abandoned.

[30] Foreign Application Priority Data

Nov. 11, 1969 Netherlands .................... 6916987

[52] U.S. Cl. .................... 357/44; 357/35; 357/36; 357/40; 357/46; 357/48; 307/303

[51] Int. Cl. .................... H01l 19/00

[58] Field of Search .......... 317/235; 357/35, 36, 40, 357/44, 46, 48; 307/303

[56] References Cited

UNITED STATES PATENTS

| | | | |
|---|---|---|---|
| 3,562,548 | 2/1971 | Armgarth | 317/235 X |
| 3,581,165 | 5/1971 | Seecbach et al. | 317/235 |
| 3,631,311 | 12/1971 | Engbert | 317/235 R |
| 3,648,130 | 3/1972 | Castrucci et al. | 357/48 |
| 3,713,908 | 1/1973 | Agusta et al. | 357/35 |

*Primary Examiner*—Andrew J. James
*Assistant Examiner*—Joseph E. Clawson, Jr.
*Attorney, Agent, or Firm*—Frank R. Trifari; Leon Nigohosian

[57] ABSTRACT

A semiconductor device, particularly an integrated semiconductor circuit, in which in a region (island) of a given conductivity type a group of semiconductor circuit elements is provided having a common zone. According to the invention, the region comprises a highly doped zone of the same conductivity type, which within the semiconductor body substantially entirely surrounds the group of circuit elements and is not contacted or is contacted only locally. Due to the presence of said highly doped zone, the parts of the common zone belonging to the circuit elements are kept at the same potential. Application in particular in lateral transistors to ensure a fixed ratio of the emitter current.

9 Claims, 8 Drawing Figures

Figure 1:
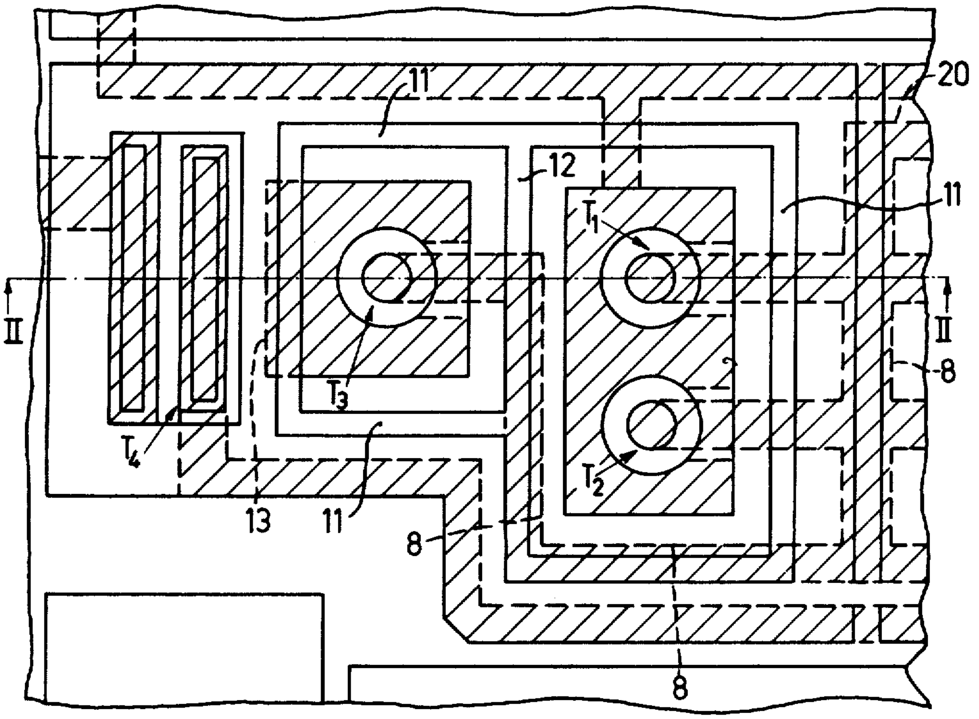

INVENTOR.
POOTHATHAMBY THARMARATNAM
BY [signature]
AGENT

*INVENTOR.*
POOTHATHAMBY THARMARATNAM

*BY* [signature]
AGENT

*INVENTOR.*
POOTHATHAMBY THARMARATNAM
*BY*
AGENT

SEMICONDUCTOR DEVICE

This is a continuation of application Ser. No. 288,919, filed Sept. 14, 1972, now abandoned, which was a continuation of Ser. No. 86,517, filed Nov. 3, 1970, now abondoned.

The invention relates to a semiconductor device having a semiconductor body comprising a region of one conductivity type adjoining a surface of the body and a group of at least two semiconductor circuit elements present in said region and having a common zone of the one conductivity type which forms part of said region.

Such structures are known and are frequently used, for example, in monolithic integrated semiconductor circuits. Such circuits are generally constructed from an epitaxial layer of the one conductivity type which is present on a substrate of the opposite conductivity type and is subdivided into islands which are electrically insulated from each other by separation diffusions of the opposite conductivity type. In such an island a number of circuit elements may be present having a common zone, for example, lateral transistors, the epitaxial layer of which of the one conductivity type forms the common base zone.

Semiconductor circuit elements are to be understood as to mean usual circuit elements which comprise at least one semiconductor zone, and which can form an electric circuit by interconnection.

In circumstances, dependent upon the circuit used, it may be very desirable for the parts of the common zone which belong to the various circuit elements of the group to have all substantially the same potential in the operating condition. This will sometimes be hard to realize, particularly when the common zone is comparatively low doped and the currents which in the operating condition flow via the common zone between the circuit elements of the group are not negligibly small. The common zone in this case forms a resistance between the elements which may give rise to an undesirable voltage drop between parts of the common zone belonging to the elements.

It has been attempted to remove this drawback by providing at the area of the group of circuit elements a highly doped buried layer which adjoins the common zone so that a considerable part of the current between two circuit elements belonging to the group flows via the buried layer and not via the lower-doped common zone.

The invention is inter alia based on the recognition of the fact that, in spite of the measure described, the current which flows through the common zone and the voltage drop associated therewith across parts of said zones, are in many cases insufficiently eliminated.

One of the objects of the invention is to remove or at least considerably reduce the above-mentioned drawbacks occurring in known structures.

According to the invention a semiconductor device of the type mentioned in the preamble is therefore characterized in that, in order to keep the active parts of the common zone belonging to the circuit elements at mutually substantially the same potential, the region comprises a highly doped zone of the one conductivity type, which, within the semiconductor body, substantially entirely surrounds the group of circuit elements and has a higher conductance than the part of the region which does not belong to said zone and is present between said circuit elements, said highly doped zone being contacted at most only locally by a metal layer at the surface.

The active part of the common zone belonging to a circuit element is to be understood to mean that part in which the charge transport which is of importance for the operation of the relative circuit element takes place mainly.

In the structure according to the invention the circuit elements belonging to said group are present as it were in a container which forms substantially an equipotential region as a result of its high doping. Since the highly doped zone according to the invention substantially entirely surrounds the group of elements, the part of the current between the elements of the group which flows in the part of the common zone which does not belong to the highly-doped zone, and the resulting undesirable voltage drop are considerably restricted.

Since the highly doped zone according to the invention has the function of a current path extending mainly parallel to the surface, said zone need not be contacted or need be contacted only at a very small region, so that little or no space is necessary for contacts at the surface. This provides a space saving and moreover the possibility of restricting the number of cross-overs between conductors at the surface.

The highly doped zone may be separated entirely or partly from the semiconductor surface by a very thin lower doped part of the region of the one conductivity type. Advantageously, however, the part of the surface to which the highly doped zone adjoins, substantially entirely surrounds the group of circuit elements. Technically, this is most simple to realize and increases the effect of the invention.

In planar circuits, the highly doped zone will be covered for a considerable part with an electrically insulating layer, for example, of silicon oxide. A contact window may be present in said insulating layer through which window a metal layer locally adjoins the highly doped zone. In circumstances, however, it may be of advantage that the highly doped zone is entirely covered at the surface by the insulating layer so that electric connections in the form of metal layers between various circuit elements can be provided without objection on the insulating layer across the highly doped zone. This provides an extra space saving.

In many cases a highly doped zone will be sufficient which extends below the group of circuit elements and surrounds the group on the outside with a part extending substantially up to the surface. However, if the effect of equalizing the potential of the above-mentioned common zone is to be increased one or more partitions of the one conductivity type and belonging to the highly doped zone can be provided between sub-groups of one or more elements forming part of the group of circuit elements. In connection herewith, an important preferred embodiment according to the invention is characterized in that the highly doped zone comprises between at least two circuit elements belonging to said group a highly doped intermediate zone of the one conductivity type substantially adjoining the surface, each of the circuit elements being substantially entirely surrounded within the semiconductor body by said intermediate zone and a further part of said highly doped zone.

The semiconductor structure described can be realized according to various configurations and while using known methods conventionally used in semiconductor technology. According to a very efficacious embodiment, however, said region of the one conductivity type is formed by an epitaxial layer of the one conductivity type present on a substrate, the highly doped zone being formed by a buried layer of the one conductivity type present between the substrate and the epitaxial layer and at least a highly doped part of the one conductivity type substantially adjoining the surface and substantially adjoining the buried layer.

The invention is of particular importance in integrated circuits in which said region of the one conductivity type is separated from the remaining part of the semiconductor body by a p-n junction which intersects the semiconductor body only at the said surface. The region of the one conductivity type in this case forms an island of the integrated circuit.

All the circuit elements present in the region of the one conductivity type may belong to said group. According to an important preferred embodiment, however, at least one further circuit element which does not belong to said group is also present in said region and is situated outside the highly doped zone. By using the present invention, according to this preferred embodiment common zones of a group of circuit elements present, for example, in an island of an integrated semiconductor circuit, can be kept at the same potential relative to further circuit elements which are present in the island and do not belong to said group.

A very compact circuit arrangement is obtained when a part of the above-mentioned common zone also forms an active zone of one or more of said further circuit elements.

Although said group of circuit elements may consist of dissimilar circuit elements, said group is preferably formed by circuit elements of the same type and structure. According to a very important preferred embodiment, said elements comprise lateral transistors the emitters of which are advantageously interconnected and are provided with a common connection conductor. As a result of this, by using the invention, the emitter currents of said transistors obtain a fixed ratio in all circumstances and, in the case of identical transistors, substantially equal values without using emitter-series resistances necessary in known circuits.

Figure 2:
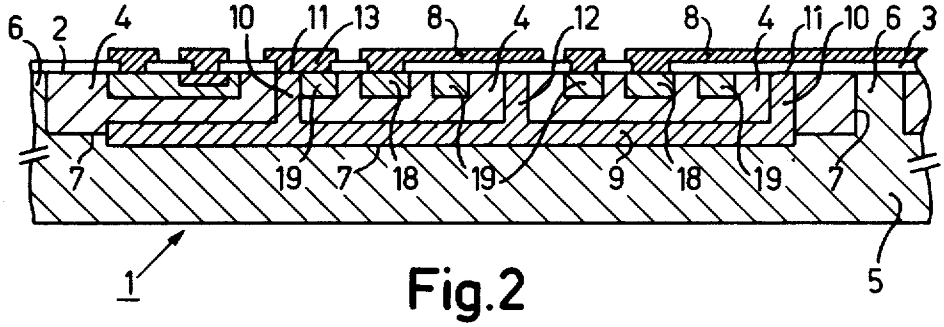
Figure 3:
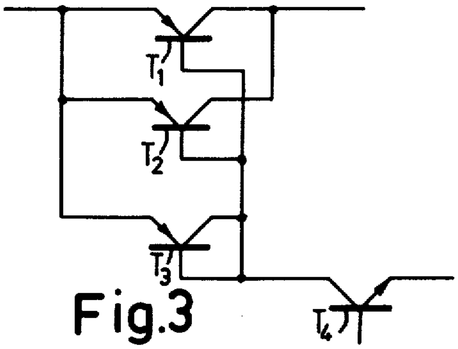
Figure 4:
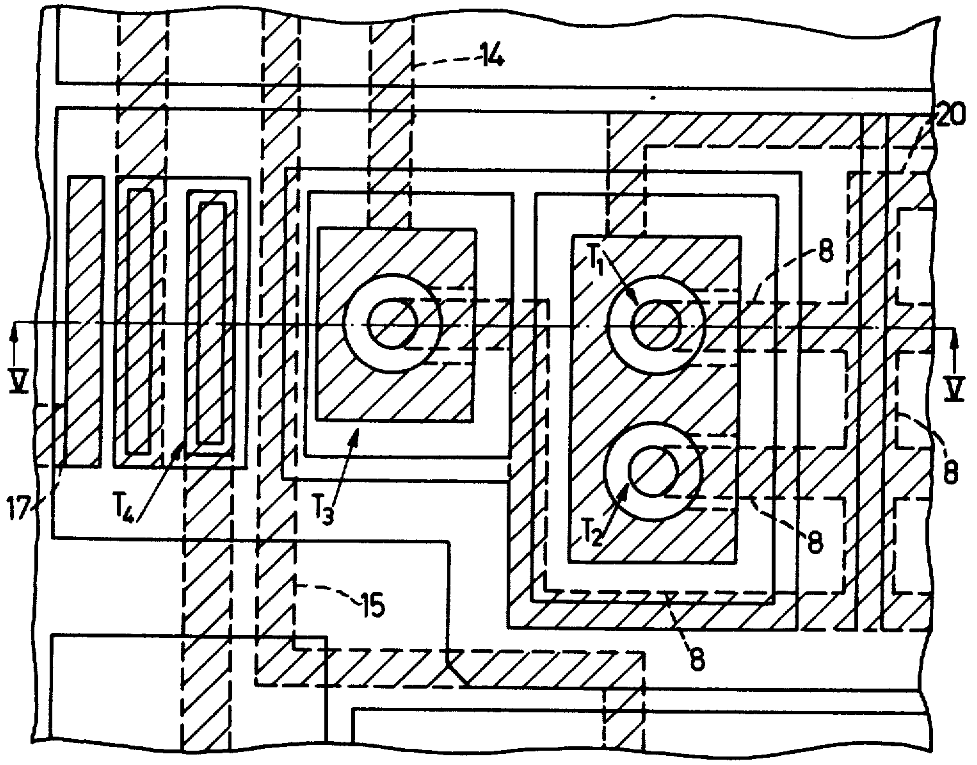
Figure 5:
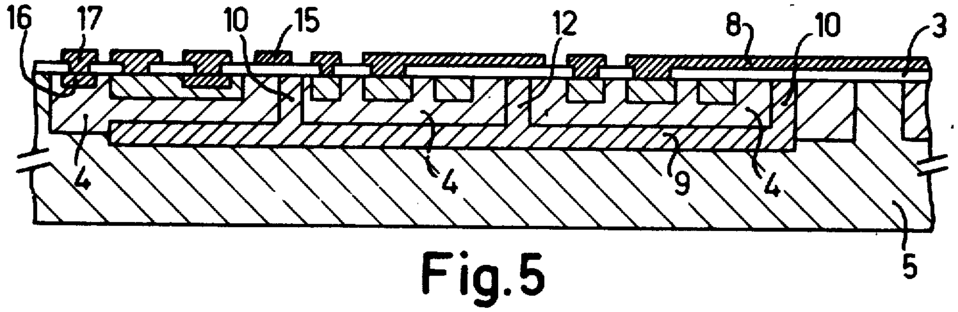

In order that the invention may be readily carried into effect, a few examples thereof will now be described in greater detail with reference to the accompanying drawings, in which:

FIG. 1 is a diagrammatic plan view of a part of an integrated semiconductor circuit according to the invention, FIG. 2 is a diagrammatic cross-sectional view of the device shown in FIG. 1 taken on the line II—II of FIG. 1, FIG. 3 shows the circuit diagram of which FIGS. 1 and 2 show the integrated form, FIG. 4 is a diagrammatic plan view of another device according to the invention, FIG. 5 is a diagrammatic cross-sectional view of the device shown in FIG. 4 taken on the line V—V of FIG. 4, and FIGS. 6, 7 and 8 are diagrammatic cross-sectional views of details of other embodiments according to the invention.

The figures are not drawn to scale for reasons of clarity. Corresponding components are referred to by the same reference numerals in the figures.

FIG. 1 is a diagrammatic plan view and FIG. 2 a diagrammatic cross-sectional view taken on the line II—II of FIG. 1 of a part of a device according to the invention. The device forms an integrated semiconductor circuit of which the part shown in the drawing is diagrammatically shown in FIG. 3.

The device comprises a semiconductor body in the form of a silicon plate 1 a surface 2 of which is provided with an insulating layer 3 of silicon oxide. An n-type conductive region 4 adjoins the surface 2. A group of three lateral p-n-p transistors $T_1$, $T_2$ and $T_3$ is provided in region 4 and has emitter zones 18 and collector zones 19 (see FIG. 2) and a common n-type base zone which forms part of the n-type region 4. A transverse n-p-n transistor $T_4$ the collector zone of which is formed by the common n-type region 4, is furthermore present in said region 4. Said region 4 consists of an epitaxially grown layer of n-type silicon having a resistivity of 0.1 ohm.cm and a thickness of 10 $\mu$m which is present on a p-type substrate 5 having a resistivity of approximately 3 ohm.cm. By p-type separation channels 6, which have been provided throughout the thickness of the epitaxial layer 4, the region with the transistors present therein is separated from the remaining part of the body by a p-n junction 7 which intersects the body only at the surface 2.

The transistors are interconnected by aluminium layers present on the oxide layer 3 as denoted by the shaded areas in FIG. 1, in such manner that the circuit shown in FIG. 3 is formed.

In this circuit, it is desirable that the emitter currents of the transistors $T_1$, $T_2$ and $T_3$ should be mutually equal or at least have mutually a fixed ratio. In practice this is usually achieved in known structures by providing series resistors in the emitter circuits.

This object, however, can also be achieved by bringing both the emitters and the bases of the transistors mutually at substantially the same potential. In that case the emitter currents of the transistors $T_1$, $T_2$ and $T_3$ will be mutually equal if the active emitter surfaces of said transistors are equal while the emitter circuits will at any rate have a fixed mutual ratio when the active emitter surfaces are unequal.

The emitters can simply be brought at the same potential, by d.c. connecting them mutually via the aluminium layer 8 (see FIG. 1). The emitters are connected to a common connection conductor in the form of an aluminium layer 20 which in circumstances may also be replaced by a metal connection wire or a highly-doped diffused zone.

Due to the comparatively high resistivity of the region 4, potential differences can occur in the above-described structure as a result of the base current in the common base zone of the lateral transistors, which potential differences cause undesirable changes in the mutual ratio of the emitter currents of the transistors.

In order to keep the active parts of the common base zones of the transistors $T_1$, $T_2$ and $T_3$ at the same potential, according to the invention the region 4 comprises a highly doped n-type zone in the form cf a diffused buried layer 9 and diffused regions 10, which highly doped zone entirely surrounds within the semiconductor body the group ($T_1$, $T_2$, $T_3$) of lateral p-n-p transistors and has a higher conductance than the part of the region 4 which does not belong to the highly doped zone and is present between the transistors $T_1$, $T_2$ and $T_3$. The transversal n-p-n transistor $T_4$ not belonging to the group ($T_1$, $T_2$, $T_3$) is present outside the highly doped zone. The parts 10 of the highly doped zone adjoin a part 11 of the surface 2, which entirely surrounds the transistors $T_1$, $T_2$ and $T_3$ (see FIG. 1). As a result of this, currents in the common base zone of said transistors will flow substantially exclusively via the highly doped zone, and the lower-doped part of the region 4 enclosed by said zone will assume everywhere substantially the same potential.

In order to increase the effect of the invention, the highly doped zone comprises, in addition to the parts 9 and 10, a partition formed by a diffused highly doped n-type intermediate zone 12, adjoining the surface 2 and adjoining the buried layer 9 between the transistor $T_3$ and the transistors $T_1$ and $T_2$ (see FIGS. 1 and 2), each of the transistors $T_1$, $T_2$ and $T_3$ being entirely surrounded within the semiconductor body by said intermediate zone 12 and a further part (9,10) of the highly doped zone. In circumstances, several of said intermediate zones may be provided, if desirable.

In the example described, the collector zone of the lateral transistor $T_3$ adjoins the region 10 of the highly doped zone, while the p-n junction between said collector zone and the region 10 is shortcircuited at the surface in a window in the oxide layer 3, by the aluminium collector contact layer 13 of the transistor so as to realize the circuit shown in FIG. 3, in which the collector of the transistor $T_4$ is connected, via the collector contact 13 and the highly doped zone (9, 10, 12), to the common base zone of the transistors $T_1$, $T_2$ and $T_3$.

The device shown in FIGS. 1 and 2 may be manufactured by using planar methods conventionally used in semiconductor technology. Starting material, for example, is a p-type substrate on which, by using known masking methods, first the buried layer 9 is provided by diffusion of a slowly diffusing impurity, for example, arsenic, and then the epitaxial layer 4 is grown. By thermal oxidation in moist oxygen at 1,200°C the oxide layer 3 is provided in which, according to known photoresist methods, windows are etched at the area of the separation channels 6 which are then provided by diffusion of boron. By means of a new photomasking and diffusion step the regions 10 and 12 are then provided by a deep phosphorus diffusion. The base zone of the transistor $T_4$ and the collector and emitter zones of the transistors $T_1$, $T_2$ and $T_3$ are then simultaneously indiffused analogously, succeeded by the indiffusion of the emitter zone of the transistor $T_4$. After etching contact windows, the various aluminium layers are then provided in normal manner by vapour-deposition, masking and etching.

The method described above by way of example can be varied in many manners by those skilled in the art dependent upon the circumstances and the requirements to be imposed upon the device.

In circumstances, particularly when many connections in the form of metal strips have to be provided per unit of surface area, it may be desirable for the highly doped zone (9, 10, 12) to be covered entirely by the oxide layer 3. A diagrammatic plan view of such a device is shown in FIG. 4 and a diagrammatic cross-sectional view taken on the line V—V of FIG. 4 is shown in FIG. 5. This device is for the greater part similar to that shown in FIGS. 1 and 2, but the collector of the transistor $T_3$ is in this case not connected to the common base zone 4, but, via an aluminium layer 14, to another point of the circuit. As a result of this, space has become available on the oxide layer between the transistors $T_3$ and $T_4$ for providing an aluminium connection 15. The collector of the transistor $T_4$ in this case is contacted via an $n^+$-contact diffusion region 16 and an aluminium layer 17.

Figure 6:
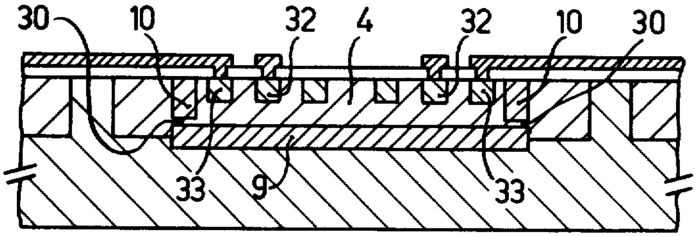
Figure 7:
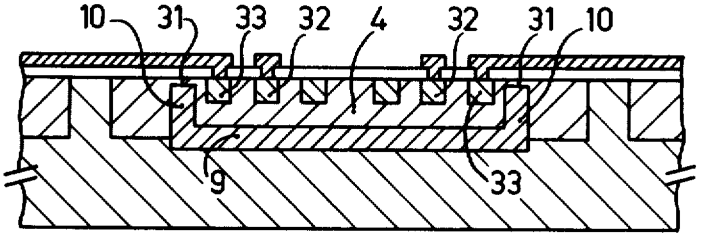

As already noted it is not strictly necessary for the highly doped zone to be constructed as a fully closed structure adjoining the surface. By way of example, FIG. 6 shows a structure in which the highly doped zone consists of an n-type buried layer 9 and an n-type part 10 which are indiffused from the surface over such a depth that between the regions 9 and 10 a very narrow region 30 of lower doping remains which, however, does substantially not influence the effect of the zone (9, 10). Such a narrow "gap" may also occur, for example, at the surface. See FIG. 7, in which the regions 10 are diffused from the buried layer 9 to the surface (by starting from a more rapidly diffusing doping impurity than that of the layer 9) and in which a very thin lower doped zone 31 is present between the surface and the region 10. In both examples, two lateral transistors having emitter zones 32 and collector zones 33 are provided within the zone (9, 10), the n-type region 4 forming the common base zone.

Figure 8:
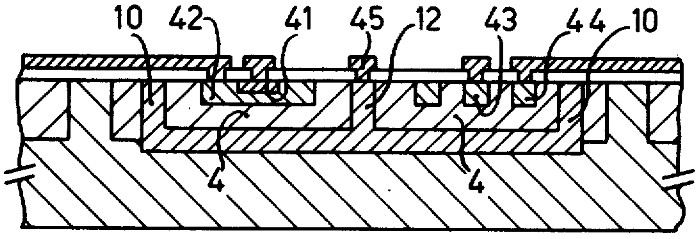

FIG. 8 finally is a diagrammatic cross-sectional view of an example of a structure in which dissimilar circuit elements are provided within the highly doped zone, (9, 10 and 12), namely in the present case the transversal n-p-n transistor having an emitter zone 41 and a base zone 42, and a lateral p-n-p transistor having an emitter zone 43 and a collector zone 44. The collector zone of the transversal transistor and the base zone of the lateral transistor form a common n-type zone 4 which, according to the invention, is kept at the same potential by the highly doped zone (9, 10, 12). The connection on the common zone is formed in this case by a metal contact 45 provided locally on the "partition" 12.

It is to be noted that, although in the examples described the highly doped regions 9, 10, and 12 were obtained by diffusion, said regions may be obtained also, if desirable, entirely or partly by using other methods, for example, epitaxial methods or ion implantation. For example, the buried layer 9 may be a highly doped epitaxial layer while the regions 10 and 12 are provided by diffusion, while other combinations may also be used.

It will be obvious that the invention is not restricted to the examples described but that many variations are possible to those skilled in the art without departing from the scope of this invention. For example, semiconductor materials other than silicon may be used, while the insulating layer may consist of materials other than silicon oxide, for example, silicon nitride or aluminium oxide. The conductivity types stated in the examples may be replaced by the opposite conductivity types, while the invention may also be used advantageously in circuit arrangements having circuit elements other than those which are stated in the examples, for example, p-n or Schottky diodes, lateral thyristors and the like, in so far as at least two of these elements have a common zone.

What is claimed is:

1. A semiconductor device comprising:

a. a semiconductor body comprising a first region of a first conductivity type adjoining a surface of said body;

b. a plurality of lateral transistors disposed in said first region and individually comprising surface emitter and collector zones of a second conductivity type and further comprising respective base zones of said first conductivity type, said emitter, base, and collector zones being disposed in said first region;

c. a highly doped zone of said first conductivity type disposed in said first region and having a higher conductance than the part of said first region located between said lateral transistors and substantially entirely surrounding in said body each of said plurality of lateral transistors, said highly doped zone comprising a part at least substantially adjoining said surface at areas of said surface that surround said lateral transistors and said highly doped zone electrically interconnecting said base zones; and d. means for electrically interconnecting said emitter zones, whereby the emitter currents of said lateral transistors have a substantially fixed ratio.

2. A semiconductor device as defined in claim 1 further comprising a substrate, said first region comprising an epitaxial layer disposed on said substrate, and said highly doped zone comprising both a buried layer disposed between said epitaxial layer and said substrate and a part at least substantially adjoining said surface and at least substantially adjoining said buried layer.

3. A semiconductor device as defined in claim 2 wherein said highly doped zone further comprises at least one highly doped partition region disposed between adjacent ones of said lateral transistors, said partition region at least substantially adjoining said buried layer and said surface.

4. A semiconductor device as defined in claim 1 wherein said first region is separated from the remaining part of said semiconductor body by a p-n junction that intersects said semiconductor body only at said surface.

5. A semiconductor device as defined in claim 1 further comprising a transistor structure comprising at least two active parts and disposed outside said highly doped zone surrounding said lateral transistors, a portion of said highly doped zone being electrically connected with one of said active parts.

6. A semiconductor device as defined in claim 5 wherein said transistor structure comprises a transverse transistor.

7. A semiconductor device as defined in claim 6 wherein said one of said active parts comprises the collector of said transverse transistor.

8. A semiconductor device as defined in claim 7 wherein said collector comprises a part of said first region of said first conductivity type.

9. A semiconductor device as defined in claim 1 wherein said highly doped zone is entirely covered at said surface by an electrically insulating layer.

* * * * *